Jan. 9, 1968 D. T. KAN 3,363,116
HIGH-SPEED TRANSISTOR PULSE REPEATER CIRCUIT
Filed June 7, 1965
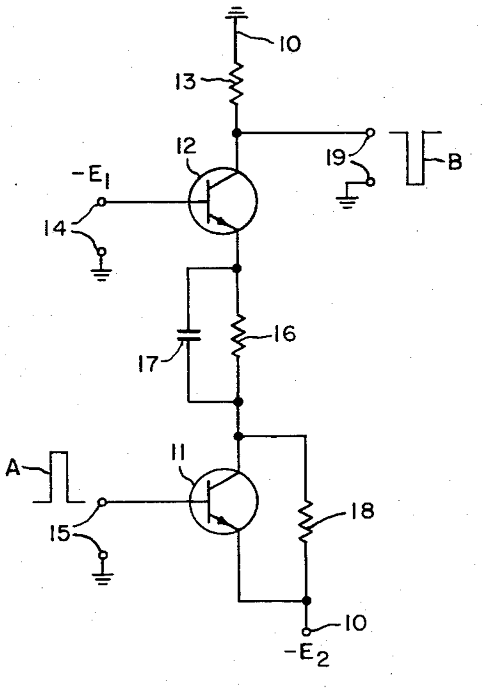

3,363,116

HIGH-SPEED TRANSISTOR PULSE REPEATER CIRCUIT

David T. Kan, Fort Lee, N.J., assignor to Fairchild Camera and Instrument Corporation, a corporation of Delaware Filed June 7, 1965, Ser. No. 461,706
1 Claim. (Cl. 307—298)

This invention relates to high-speed transistor pulse repeater circuits and, while it is of general application, it is particularly useful in high-speed switching and digital logic circuits.

It has been common practice in high-speed switching and logic circuits to use a common-emitter amplifier operating between cutoff and saturation. For high-speed switching, a high-frequency transistor with extremely low storage time is required. Unfortunately, low storage time transistors presently available also have very low breakdown voltages, so that the amount of power that can be switched is relatively small. Furthermore, the output impedance of such a circuit is not a constant, its value being dependent upon whether the transistor is cut off or conducting, preventing a proper impedance match of the circuit to a connected load.

It is an object of the invention therefore, to provide a new and improved high-speed transistor pulse repeater circuit which obviates one or more of the above-mentioned limitations of prior pulse repeater circuits.

It is another object of the invention to provide a new and improved high-speed transistor pulse repeater circuit characterized by rise and fall times of the order of a few nanoseconds.

It is a further object of the invention to provide a new and improved high-speed pulse repeater circuit characterized by a substantially constant output impedance both during the conductive and nonconductive periods of the output transistor.

In accordance with the invention, there is provided a high-speed pulse repeater circuit comprising supply circuit terminals one of which is at reference potential, a pair of transistors, each having input electrodes and output electrodes, the output electrodes thereof being connected in series across the supply circuit terminals, a load impedance interconnecting an output electrode of one of the transistors and the supply circuit terminal at reference potential, a circuit for applying a constant bias to the base of the one transistor, a circuit for applying a constant bias to an output electrode of the other transistor, and pulse-signal supply terminals coupled to the input electrodes of the other transistor, the parameters of the circuit being proportioned so that the other transistor operates at current saturation for the duration of a pulse signal and the one transistor operates substantially below current saturation.

For a better understanding of the present invention, together with other and further objects thereof, reference is had to the following description, taken in connection with the accompanying drawing, while its scope will be pointed out in the appended claim.

Referring now to the drawing:

The single figure is a schematic circuit diagram of a high-speed transistor pulse repeater circuit embodying the present invention.

Referring now more particularly to the drawing, there is represented a high-speed pulse repeater circuit comprising supply circuit terminals 10, 10 one of which is at a reference potential, for example ground, as illustrated. The circuit further comprises a pair of transistors 11 and 12, each having conventional base-emitter input electrodes and collector-emitter output electrodes, the output electrodes being connected in series across the terminals 10, 10. The circuit further comprises a load impedance, such as a resistor 13, interconnecting the output collector electrode of transistor 12 and the terminal 10 at ground potential. A circuit including terminals 14 is provided for applying a constant bias $-E_1$ to the base of transistor 12. A constant bias $-E_2$ from terminal 10 is applied to the emitter electrode of the other transistor 11 while a pulse signal A from supply terminals 15 is coupled to the input electrodes comprising the base and emitter of transistor 11.

The circuit of the invention further comprises a parallel-connected resistor 16 and capacitor 17 interposed between the adjacent output electrodes of transistors 11 and 12. The value of resistor 16 is selected so that, with resistor 13, it limits the maximum currents drawn from the sources $-E_1$ and $-E_2$ to desired values. The value of capacitor 17 is selected so as to compensate for the effect of the inherent capacitance of the input circuit of transistor 12. The parameters of the circuit described are so proportioned that the transistor 11 operates at current saturation for the duration of the input signal pulse A while the transistor 12 operates substantially below current saturation during this interval. A resistor 18 is connected in parallel with the output electrodes of transistor 11 and is of a value of a higher order of magnitude than the collector-emitter path of the transistor 12 during conduction. Output terminals 19 are connected across load resistor 13, at which terminals appear the output pulse B.

It is believed that the operation of the pulse repeater circuit of the invention will be apparent from the foregoing description. In brief, application of a positive input pulse A to the input electrodes of transistor 11 drives this transistor to current saturation, lowering the potential of the collector of transistor 11 and the emitter of transistor 12 and thus making the transistor 12 conductive. However, as stated previously, the circuit values are such that, under this condition, the transistor 12 does not reach current saturation. Since the storage time in the base region of a transistor is a maximum at current saturation, the transistor 12 need not be a transistor with a low storage time but may be a conventional high-voltage radio-frequency power transistor having high breakdown voltage.

While the transistor 11 is conductive, the potential at its collector and at the emitter of transistor 12 remains constant and, since a constant potential $-E_1$ is applied to the base of transistor 12, the collector current of transistor 12 also remains constant during this conducting interval. Further, it will be noted that the value of the load impedance 13 at the output terminals 19 remains constant, both during the conducting and nonconducting periods of the transistor 12.

In order to prevent the emitter of transistor 12 from floating when the transistor 11 is cut off, a resistor 18 is connected in parallel with the output electrodes of transistor 11 but is of sufficiently high value to permit only a very small current flow.

It can be shown that the collector current $I_{C_2}$ of transistor 12 is approximately equal to the collector current $I_{C_1}$ of transistor 11, both being represented by the expression:

$$\alpha \frac{E_2 - E_1 - V_{be} - V_{ce}}{R_e}$$

where:

$R_e$=value of resistor 16

$V_{be}$=base to emitter voltage of transistor 12

$V_{ce}$=collector to emitter saturation voltage of transistor 11.

The product of the collector current $I_{C_2}$ and the value of resistor 13 represents the magnitude of the power of the output pulse B.

Due to the fact that transistor 12 operates substantially below saturation with a minimum of carrier storage at its base electrode, it may be switched between the conducting and nonconducting states extremely fast so that the rise and fall times of the output pulse B are also very short. If both of the transistors 11 and 12 have parameters $f_t$ of substantially the same value, the rise time of the collector current of transistor 12 is substantially the same as that of transistor 11, so that there is very little deterioration in the current rise time and fall time due to the presence of the transistor 12. This arises from the fact that the transistor 12 is connected as a common-base amplifier which has a theoretical maximum cutoff frequency $t_\alpha \approx f_t$ which is many times that of a common-emitter amplifier, $f_\beta = f_\alpha/\beta$.

The capacitor 17 is included to compensate for base-to-emitter capacitance of the transistor 12 so that the base-emitter resistance of transistor 12 and resistor 16 forms a voltage-divider with a linear frequency characteristic.

In the foregoing description, it has been assumed that the transistors 11 and 12 are both of the N-P-N type which yield a negative output pulse B. If the transistors are of the P-N-P type, the output pulse B will be a positive going pulse.

While the pulse repeater circuit of the invention may employ circuit parameters having a wide range of values, depending upon its application, one repeater circuit which has been found satisfactory for developing a pulse output of 20 volts into a load of 50 ohms with a rise time of less than 5 nanoseconds and a fall time less than 5 nanoseconds has employed circuit elements having the following parameters:

| | | |
|---|---|---|
| Resistor 13 | ohms | 50 |
| Resistor 16 | do | 10 |
| Resistor 18 | kilohms | 30 |
| Capacitor 17 | μμf | 47 |
| Voltage $E_1$ | v | —26 |
| Voltage $E_2$ | v | —30 |
| Transistor 11 | Type | 2N3303 |
| Transistor 12 | Type | 2N3553 |

While there has been described what is, at present, considered to be the preferred embodiment of the invention, it will be obvious to those skilled in the art that various changes and modifications may be made therein, without departing from the invention, and it is, therefore, aimed in the appended claim to cover all such changes and modifications as fall within the true spirit and scope of the invention.

What is claimed is:

1. A high-speed pulse repeater circuit comprising:

supply circuit terminals one of which is at reference potential;

a pair of transistors, each having at least one input electrode and output electrodes, said output electrodes being included with like polarity in a series circuit connected across said terminals;

a load impedance interconnecting an output electrode of one of said transistors and said terminal at reference potenial;

an output circuit coupled across said impedance;

a first circuit for applying a constant bias to the input electrode of said one transistor;

a second circuit for applying a constant bias to an output electrode of the other of said transistors;

pulse-signal supply terminals coupled to the input electrode of said other transistor;

the parameters of the repeater circuit components being proportioned so that both of said transistors are rendered conductive for the duration of a pulse signal and nonconductive between signal pulses, said one transistor having the characteristic of saturating at a much higher value of emitter current than said other transistor;

and a resistor connected in parallel with the output electrodes of said other transistor and having a value of a higher order of magnitude than the resistance of said one transistor during conduction.

References Cited

UNITED STATES PATENTS

| | | | |
|---|---|---|---|
| 2,926,307 | 2/1960 | Ehret | 330—8 |
| 3,007,061 | 10/1961 | Gindi | 307—88.5 |
| 3,121,807 | 2/1964 | Stephens | 307—88.5 |
| 3,124,758 | 3/1964 | Bellamy et al. | 330—18 |
| 3,168,656 | 2/1965 | Kobbe | 307—88.5 |
| 3,271,590 | 9/1966 | Sturman | 307—88.5 |

ARTHUR GAUSS, *Primary Examiner.*

S. D. MILLER, *Assistant Examiner.*